US012672270B2

(12) United States Patent
Takata

(10) Patent No.: US 12,672,270 B2
(45) Date of Patent: Jun. 30, 2026

(54) PART FEEDER AND COMPONENT MOUNTING MACHINE

(71) Applicant: Panasonic Intellectual Property Management Co., Ltd., Osaka (JP)

(72) Inventor: Chikara Takata, Fukuoka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 722 days.

(21) Appl. No.: 18/044,243

(22) PCT Filed: Sep. 21, 2021

(86) PCT No.: PCT/JP2021/034450
§ 371 (c)(1),
(2) Date: Mar. 7, 2023

(87) PCT Pub. No.: WO2022/071004
PCT Pub. Date: Jul. 4, 2022

(65) Prior Publication Data
US 2023/0337409 A1 Oct. 19, 2023

(30) Foreign Application Priority Data
Sep. 30, 2020 (JP) .................................. 2020-165119

(51) Int. Cl.
*H01F 7/06* (2006.01)
*H05K 13/02* (2006.01)
*H05K 13/04* (2006.01)
(52) U.S. Cl.
CPC ......... *H05K 13/02* (2013.01); *H05K 13/0408* (2013.01)

(58) Field of Classification Search
CPC .. H05K 13/02; H05K 13/021; H05K 13/0408; H05K 13/0419; H05K 13/086
See application file for complete search history.

(56) References Cited

U.S. PATENT DOCUMENTS 8,999,108 B2 * 4/2015 Nagao ................ H05K 13/0417
156/941
9,611,114 B2 * 4/2017 Shimizu ............. H05K 13/0419
(Continued)

FOREIGN PATENT DOCUMENTS

JP 2007-173701 A 7/2007
JP 2012-069669 A 4/2012
(Continued)

OTHER PUBLICATIONS

International Search Report issued in Patent Application No. PCT/JP2021/034450 dated Dec. 14, 2021.

*Primary Examiner* — Paul D Kim
(74) *Attorney, Agent, or Firm* — McDonald Hopkins LLC

(57) ABSTRACT

Part feeder (13) of the present disclosure includes body (41) that includes a component supply mechanism that supplies a component at component extraction position (13K), slot insertion portion (42) that slides in one direction along a slot provided at feeder base (22), fixed member (51) that protrudes in the one direction from the body, and is fixed to fixing mechanism (31) provided at feeder base (22), unfixing member (52) that performs an unfixing operation of operating fixing mechanism (31) to release the fixing of fixed member (51) by fixing mechanism (31), operation member (53) that is displaced by receiving an external force, and transmission mechanism (60) that transmits the displacement of the operation member to the unfixing member to perform the unfixing operation.

16 Claims, 15 Drawing Sheets

(56)     References Cited

U.S. PATENT DOCUMENTS

| 9,743,568 | B2 * | 8/2017 | Kanai | ................ | H05K 13/0084 |
| 10,225,970 | B2 * | 3/2019 | Eguchi | .............. | H05K 13/0419 |
| 2016/0316592 | A1 * | 10/2016 | Eguchi | .............. | H05K 13/0419 |

FOREIGN PATENT DOCUMENTS

| JP | 2014-003160 A | 1/2014 |
| WO | 2013/038873 A1 | 3/2013 |

* cited by examiner

PART FEEDER AND COMPONENT MOUNTING MACHINE

TECHNICAL FIELD

The present disclosure relates to a part feeder used by being attached to a slot groove of a feeder base included in a component mounting machine, and a component mounting machine including the part feeder.

BACKGROUND ART

In the related art, a part feeder functioning as a component supply unit in a component mounting machine that mounts a component to a board includes a slot insertion portion in a lower portion of a body including a component supply mechanism that supplies a component to a component supply port. The slot insertion portion is attached to a feeder base by being horizontally inserted into a slot groove formed in the feeder base. A lever-shaped operation member is provided at the body. When the operation member is operated in a vertical direction in a state where the slot insertion portion is inserted into the slot groove, a clamp member coupled to the operation member by a link mechanism activates to clamp a clamped portion provided in the feeder base, and thus, the part feeder is fixed to the feeder base (see, for example, PTL 1 below).

CITATION LIST

Patent Literature

PTL 1: Unexamined Japanese Patent Publication No. 2014-3160

SUMMARY OF THE INVENTION

In the component mounting machine, a replacement operation of changing the arrangement or the number of part feeders in the feeder base occurs according to a change in a type of a board on which the component is mounted. In a manufacturing factory using the component mounting machine, since the type of the board is frequently changed (model change), there is an increasing demand for improving efficiency of the replacement operation of the part feeder. It has been studied to automate the replacement operation of the part feeder, and it is desirable that the replacement operation can be performed by an operation suitable for automation.

Therefore, an object of the present disclosure is to provide a part feeder and a component mounting machine capable of efficiently performing a replacement operation of a part feeder with respect to a feeder base.

A part feeder of the present disclosure is a part feeder used by being attached to a slot of a feeder base included in a component mounting machine. The part feeder includes a body that includes a component supply mechanism that supplies a component at a component extraction position at which a mounting head included in the component mounting machine extracts the component, a slot insertion portion that is provided at the body, and slides in one direction to be inserted into the slot, a fixed member that protrudes in the one direction from the body, and is fixed to a fixing mechanism provided at the feeder base by the sliding, an unfixing member that performs an unfixing operation of operating the fixing mechanism to which the fixed member is fixed to release the fixing of the fixed member by the fixing mechanism, an operation member that is displaced by receiving an external force, and a transmission mechanism that transmits the displacement of the operation member to the unfixing member to perform the unfixing operation.

A component mounting machine of the present disclosure is a component mounting machine that includes a part feeder that supplies a component, a feeder base that includes a slot in which the part feeder is mountable, and a mounting head that picks up the component supplied by the part feeder mounted on the slot and mounts the component on a board, the component mounting machine includes a fixing mechanism for fixing the part feeder to the feeder base. The part feeder includes a body that includes a component supply mechanism that supplies the component at a component extraction position at which the mounting head extracts the component, a slot insertion portion that is provided at the body, and slides in one direction to be inserted into the slot, a fixed member that protrudes in the one direction from the body, and is fixed to the fixing mechanism by the sliding, an unfixing member that performs an unfixing operation of operating the fixing mechanism to which the fixed member is fixed to release the fixing of the fixed member by the fixing mechanism, an operation member that is displaced by receiving an external force, and a transmission mechanism that transmits the displacement of the operation member to the unfixing member to perform the unfixing operation.

According to the present disclosure, the replacement operation of the part feeder with respect to the feeder base can be efficiently performed.

DESCRIPTION OF EMBODIMENT

Figure 1:
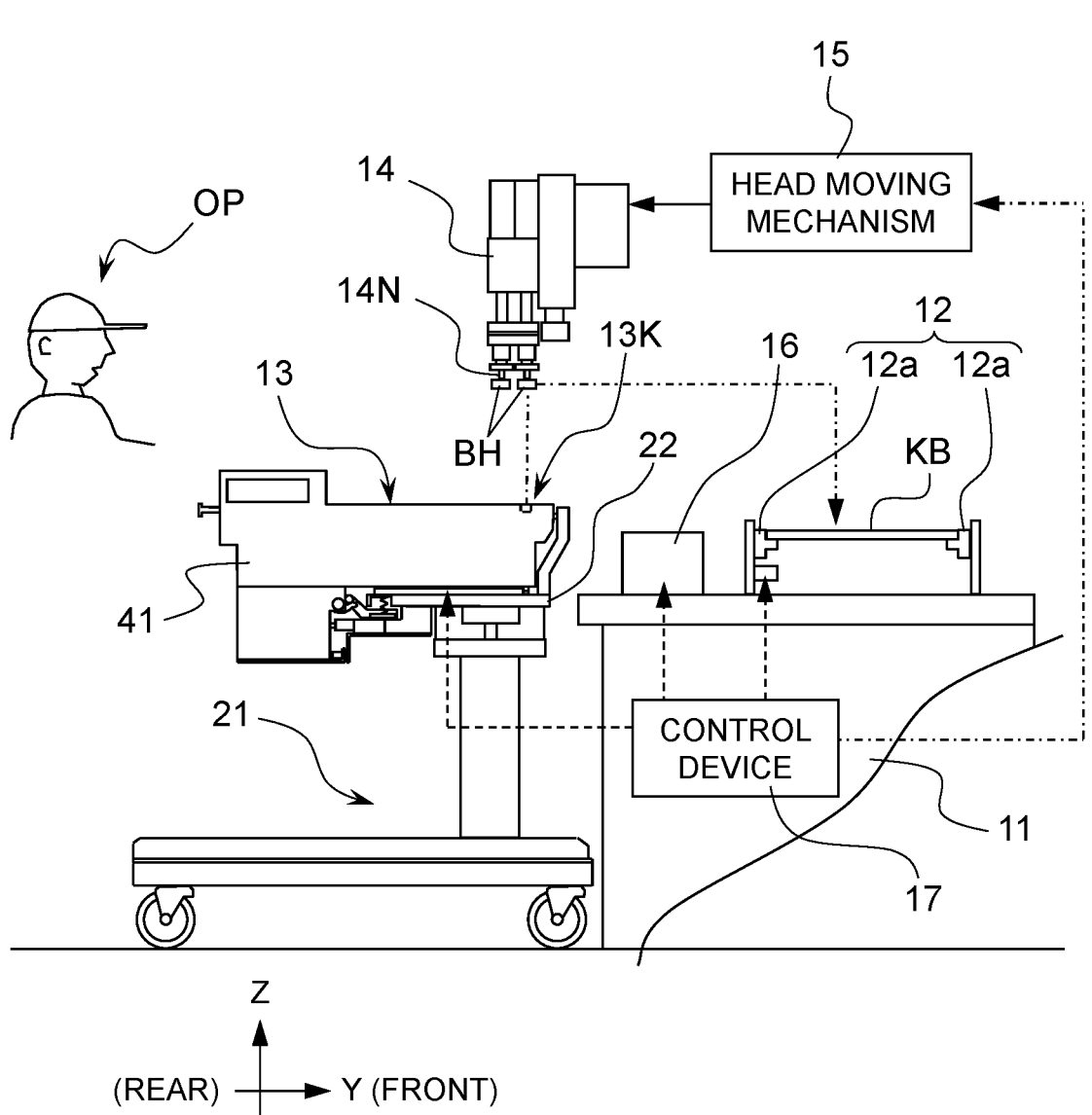
FIG. 1 is a side view of a main part of a component mounting machine according to an exemplary embodiment of the present disclosure.

Hereinafter, an exemplary embodiment of the present disclosure will be described with reference to the drawings. FIG. 1 illustrates component mounting machine 1 according to the exemplary embodiment of the present disclosure. Component mounting machine 1 is a machine that repeatedly executes a component mounting operation of mounting component BH onto board KB loaded from an upstream step side and unloading component BH to a downstream step side. Here, for the sake of convenience in description, a horizontal axis along a conveyance direction of board KB in component mounting machine 1 is defined as an X axis, a horizontal axis orthogonal to the X axis is defined as a Y axis, and a vertical axis orthogonal to the X axis and the Y axis is defined as a Z axis. A direction along the X axis as viewed from operator OP is referred to as a left-right direction, a direction along the Y axis is referred to as a front-rear direction, and for each component, a side farther from operator OP is referred to as "front", and a side closer to operator OP is referred to as "rear".

In FIG. 1, component mounting machine 1 includes base 11, board conveyance path 12, part feeder 13, mounting head 14, head moving mechanism 15, component recognition camera 16, and control device 17. Board conveyance path 12 includes a pair of belt conveyors 12a, and is provided to extend on base 11 along the X axis. Board conveyance path 12 loads board KB sent from the upstream step side and positions board KB at a predetermined operation position.

In FIG. 1, feeder carriage 21 is coupled to a front side of base 11 as viewed from operator OP, that is, a rear end of base 11. Feeder base 22 is provided at an upper portion of feeder carriage 21. Part feeder 13 is detachably attached to feeder base 22, and supplies component BH to component supply port 13K provided on a back side, that is, a front portion as viewed from operator OP. A plurality of part feeders 13 can be attached to feeder base 22 along the X axis. When feeder carriage 21 is coupled to base 11, the plurality of part feeders 13 attached to feeder base 22 are collectively connected to base 11.

In FIG. 1, mounting head 14 includes a plurality of nozzles 14N extending downward. Each nozzle 14N can perform an elevating operation and a rotating operation around the Z axis. A vacuum pressure supplied from a vacuum source (not illustrated) is supplied, and thus, an adsorption force can be generated at a lower end. Head moving mechanism 15 includes, for example, an XY table mechanism, and moves mounting head 14 along a horizontal plane (XY plane) in an area above base 11.

In FIG. 1, component recognition camera 16 is provided in an area between board conveyance path 12 and feeder carriage 21 on base 11. Component recognition camera 16 has an imaging optical axis directed upward. Component recognition camera 16 captures each component BH when mounting head 14 that has sucked component BH with nozzle 14N passes above.

Control device 17 controls an operation of each unit constituting component mounting machine 1. Specifically, control device 17 controls a conveying operation of board KB by board conveyance path 12 and a positioning operation to the operation position, and controls a supply operation of component BH by each part feeder 13. Control device 17 controls the elevating and the rotating operations of each of the plurality of nozzles 14N included in mounting head 14, and performs control such that the adsorption force of component BH is generated at the lower end of each nozzle 14N. Control device 17 activates head moving mechanism 15 to perform control such that mounting head 14 is moved. Control device 17 also controls an imaging operation of component recognition camera 16.

When component mounting machine 1 performs a component mounting operation, first, board conveyance path 12 receives board KB sent from the upstream step side and positions board KB at the operation position. When board KB is positioned, head moving mechanism 15 activates to move mounting head 14 above part feeder 13, and mounting head 14 adsorbs component BH to each of the plurality of nozzles 14N. Mounting head 14 with component BH adsorbed to nozzle 14N is moved to pass above component recognition camera 16, and component recognition camera 16 recognizes each component BH.

When component recognition camera 16 recognizes component BH, head moving mechanism 15 moves mounting head 14 above board KB, and mounting head 14 mounts component BH to target mounting coordinates set on board KB. When a series of operations including adsorption, recognition, and mounting of component BH is repeatedly executed and all components BH to be mounted on board KB are mounted, board conveyance path 12 activates to unload board KB to the downstream step side. As a result, the component mounting operation per board KB is ended.

In component mounting machine 1 having such a configuration, the present exemplary embodiment is characterized by a configuration of part feeder 13, and the description thereof will be given below.

Figure 3:
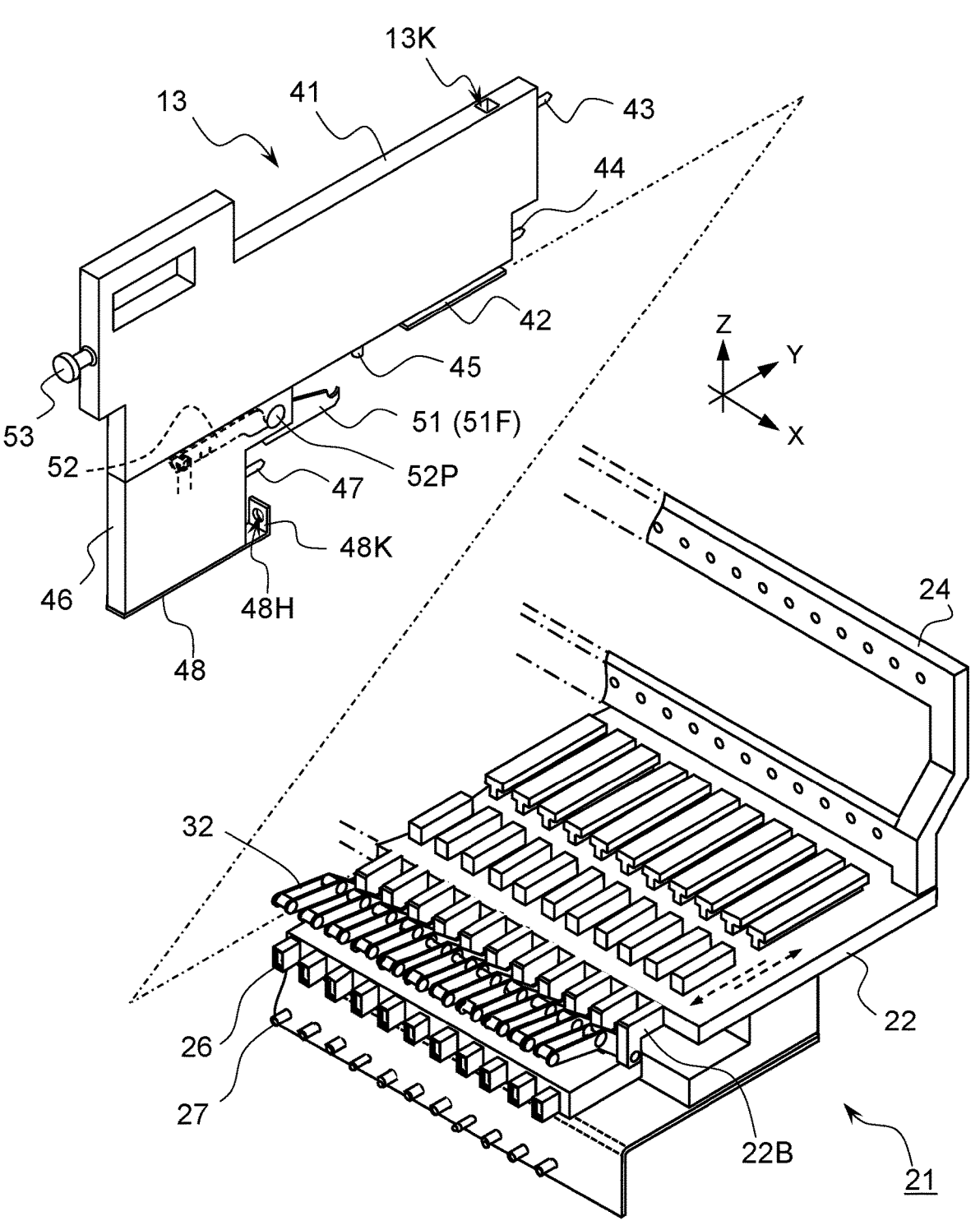
FIG. 3 is a perspective view of a feeder base included in the component mounting machine according to the exemplary embodiment of the present disclosure and the part feeder attached to the feeder base.
Figure 4:
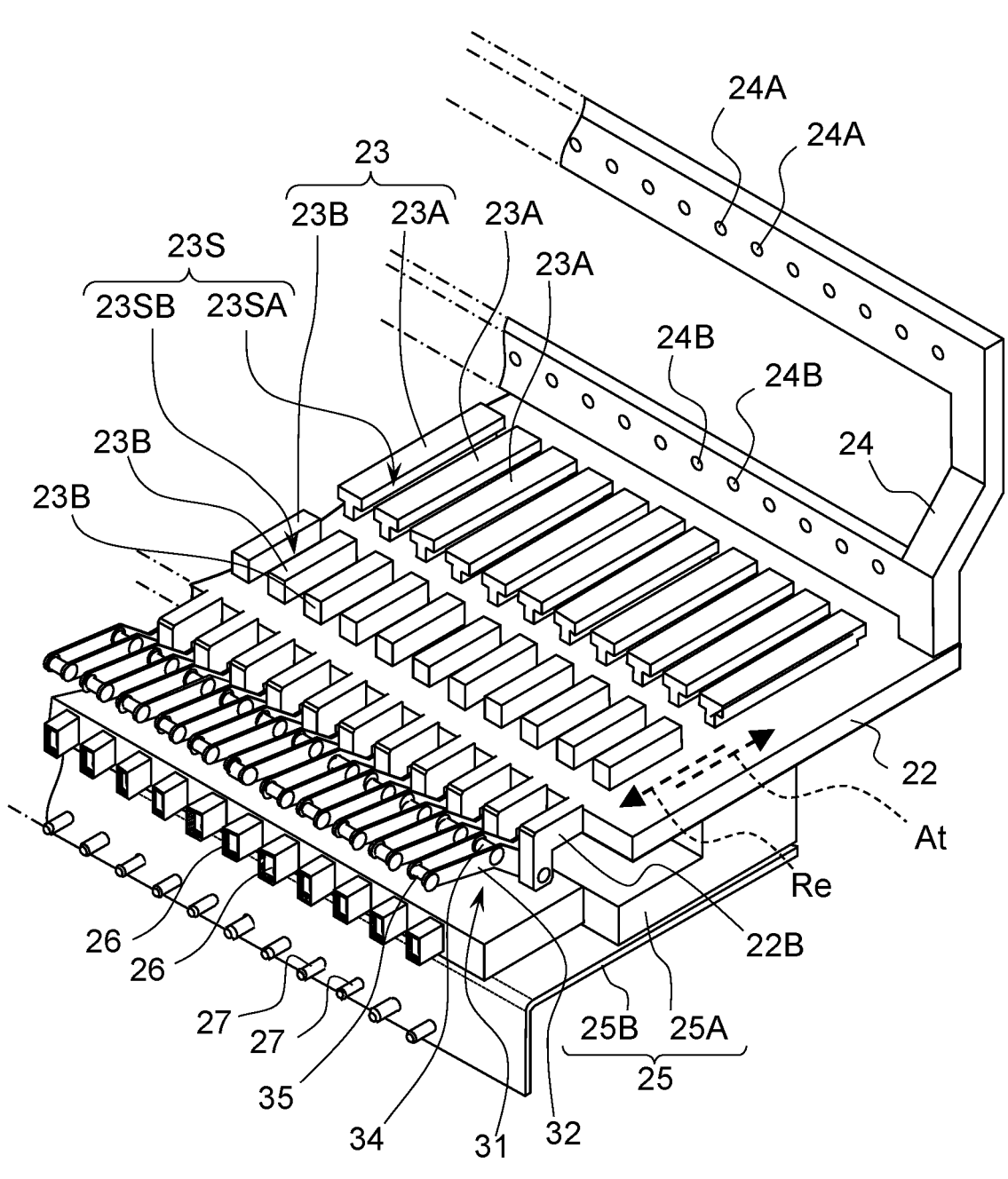
FIG. 4 is a perspective view of the feeder base included in the component mounting machine according to the exemplary embodiment of the present disclosure.

First, a configuration of feeder base 22 to which part feeder 13 is attached will be described. FIG. 3 is a perspective view of feeder base 22 included in component mounting machine 1 and part feeder 13 attached thereto. FIG. 4 is a perspective view of feeder base 22. In FIGS. 3 and 4, feeder base 22 is made of a plate-like member formed in a rectangular shape as a whole. On an upper surface of feeder base 22, a plurality of slot forming members 23 are arranged at intervals along the X axis. Slot forming member 23 forms a slot for mounting part feeder 13 to feeder base 22. One slot forming member 23 includes first slot forming member 23A arranged in a front area of the upper surface of feeder base 22 (a farther upper surface area as viewed from operator OP) and second slot forming member 23B arranged in a rear area (a closer upper surface area as viewed from operator OP). First slot forming member 23A is a bar-shaped member elongated along the Y axis having a T-shaped cross section, and second slot forming member 23B is a block-shaped member having a side surface parallel to a YZ plane. One slot (slot groove 23S) is formed between first slot forming member 23A and adjacent another first slot forming member 23A and between second slot forming member 23B and adjacent another second slot forming member 23B at an interval in an X direction.

Figure 7A:
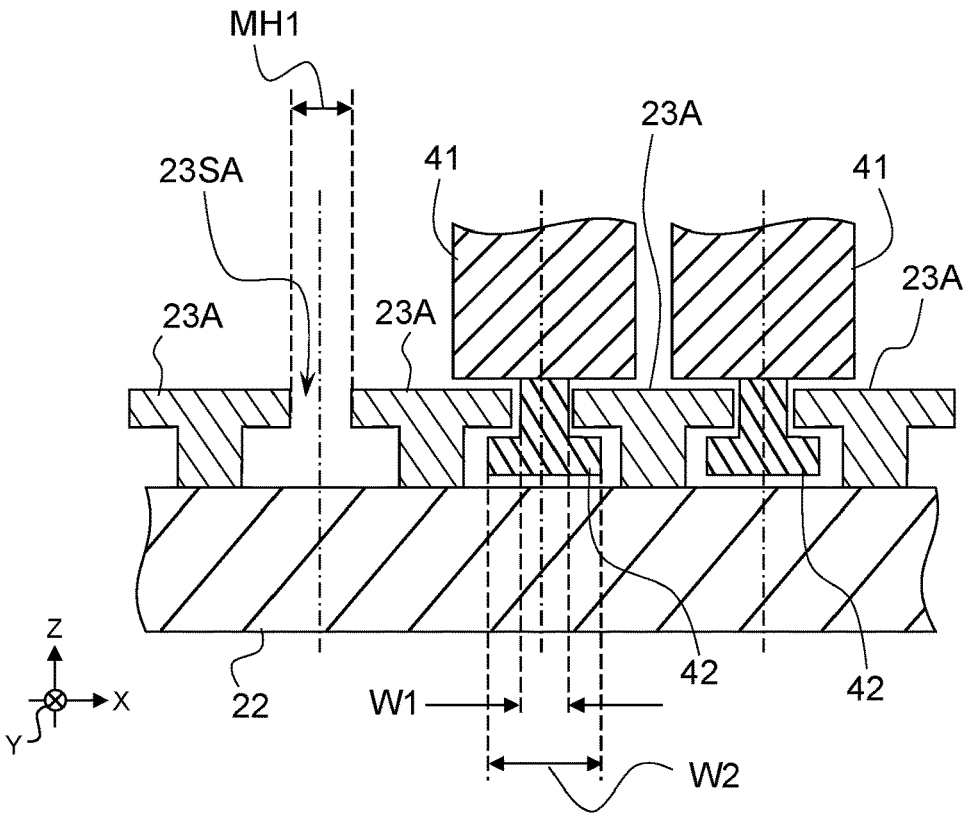
FIG. 7A is a cross-sectional view illustrating a state where the part feeder is mounted on a slot groove of the feeder base included in the component mounting machine according to the exemplary embodiment of the present disclosure.
Figure 7B:
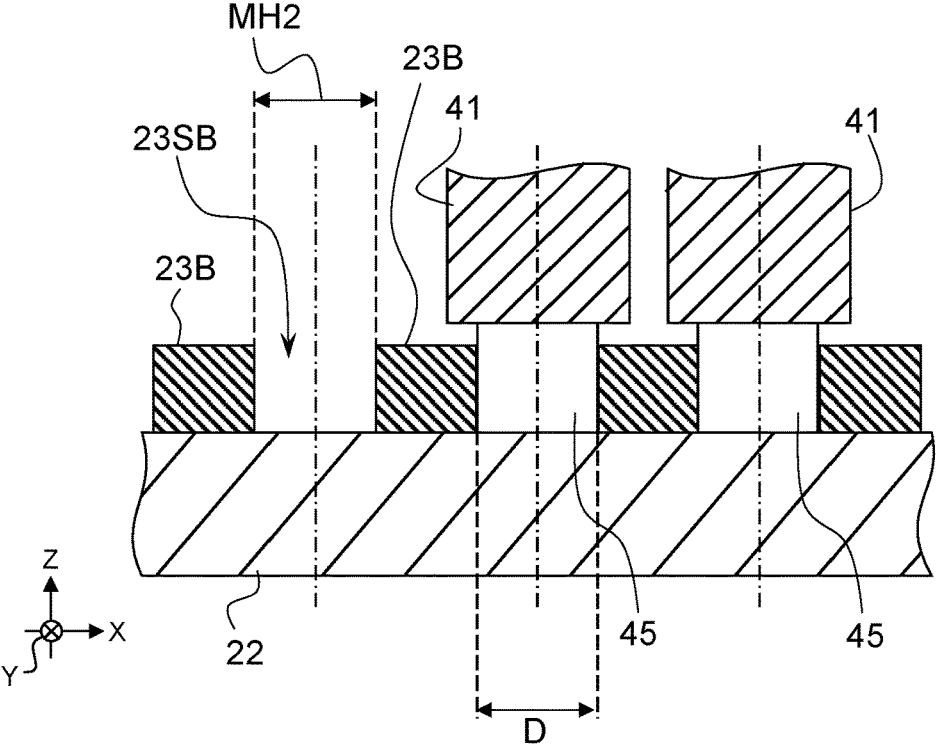
FIG. 7B is a cross-sectional view illustrating a state where the part feeder is mounted in the slot groove of the feeder base included in the component mounting machine according to the exemplary embodiment of the present disclosure.

FIG. 7A is an XZ cross-sectional view of first slot forming member 23A and feeder base 22. As illustrated in the drawing, two first slot forming members 23A arranged at distance MH1 in the X direction form first slot groove 23SA having an inverted T-shaped cross section. FIG. 7B is an XZ cross-sectional view of second slot forming member 23B and feeder base 22. As illustrated in the drawing, two second slot forming members 23B arranged at distance MH2 in the X direction form second slot groove 23SB having width MH2. First slot groove 23SA and second slot groove 23SB are provided in series along the Y axis to form one slot groove 23S. In the present exemplary embodiment, one slot groove 23S constitutes one slot. In other words, the slot is an upwardly opened groove formed by side surfaces of two slot forming members 23 and the upper surface of feeder base 22 exposed from between two slot forming members 23.

In FIG. 3, each part feeder 13 is selectively inserted and attached to one of the plurality of slot grooves 23S. At this time, part feeder 13 slides to be inserted from the front side to the back side of slot groove 23S as viewed from operator OP. Hereinafter, this sliding direction is referred to as a mounting direction (dashed arrow At in FIG. 4). When part feeder 13 is detached from slot groove 23S, part feeder 13 is slid in an unmounting direction (dashed arrow Re in FIG. 4) opposite to mounting direction At.

In FIGS. 3 and 4, feeder stopper 24 for positioning part feeder 13 inserted into slot groove 23S is provided at an end on a back side of feeder base 22. Upper pin insertion hole 24A and lower pin insertion hole 24B are provided in an upper portion and a lower portion of feeder stopper 24 in an arrangement corresponding to each slot groove 23S. As will be described later, part feeder 13 includes upper pin 43 and lower pin 44 at a distal end thereof, and when part feeder 13 is inserted into slot groove 23S and moves in mounting direction At, upper pin 43 is inserted into upper pin insertion hole 24A, and lower pin 44 is inserted into lower pin insertion hole 24B. As a result, at least a position (height position) of the distal end of part feeder 13 in a direction along the Z axis and a position in the direction along the X axis are determined.

In FIGS. 3 and 4, bracket 25 having a shape projecting rearward and downward of feeder base 22 is provided on a lower surface of a rear portion of feeder base 22 (front side as viewed from operator OP). In the present exemplary embodiment, bracket 25 includes first member 25A mounted on the lower surface of feeder base 22 and second member 25B mounted on a lower surface of first member 25A. First member 25A extends rearward along the Y axis, and socket 26 is provided on a rear end surface thereof in the arrangement corresponding to each slot groove 23S. Socket 26 is one member constituting a connector for electric wiring. Second member 25B has an L-shaped cross section in which the second member extends rearward along the Y axis and has a rear end bent downward. Engagement pin 27 is provided at a portion bent downward in the arrangement corresponding to each slot groove 23S. Both socket 26 and engagement pin 27 are provided in a state of protruding rearward along a Y axis direction.

Figure 5A:
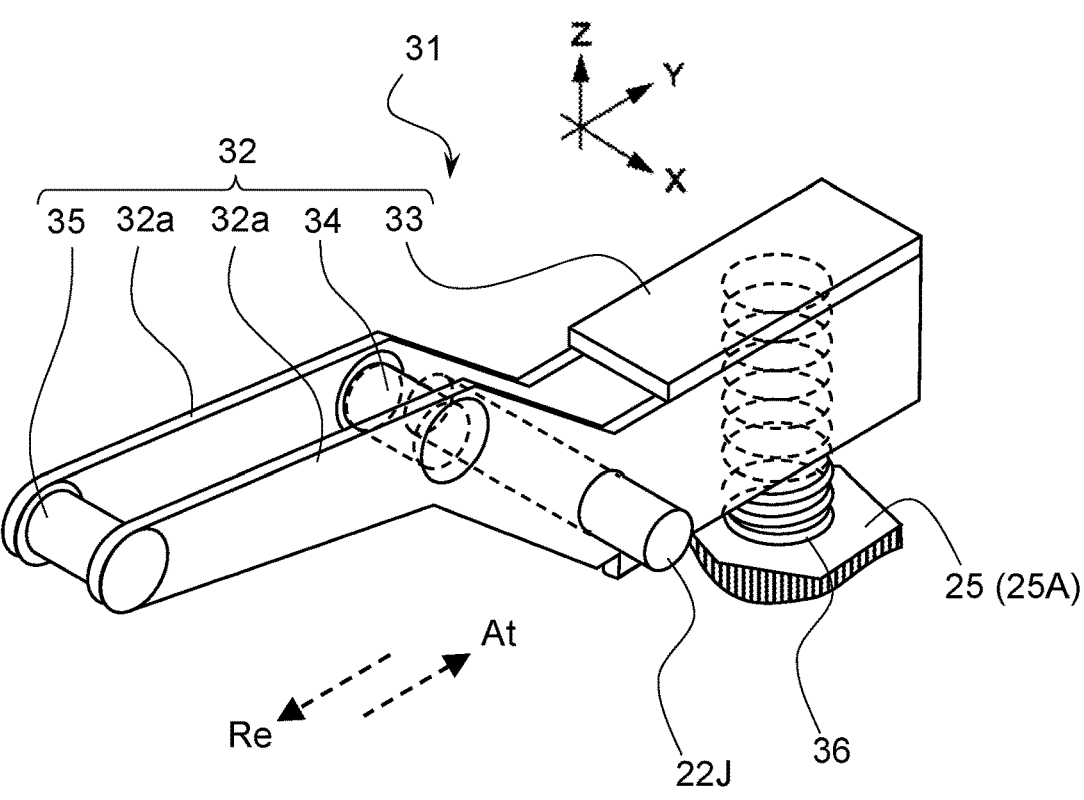
FIG. 5A is a perspective view of a fixing mechanism included in the component mounting machine according to the exemplary embodiment of the present disclosure.
Figure 5B:
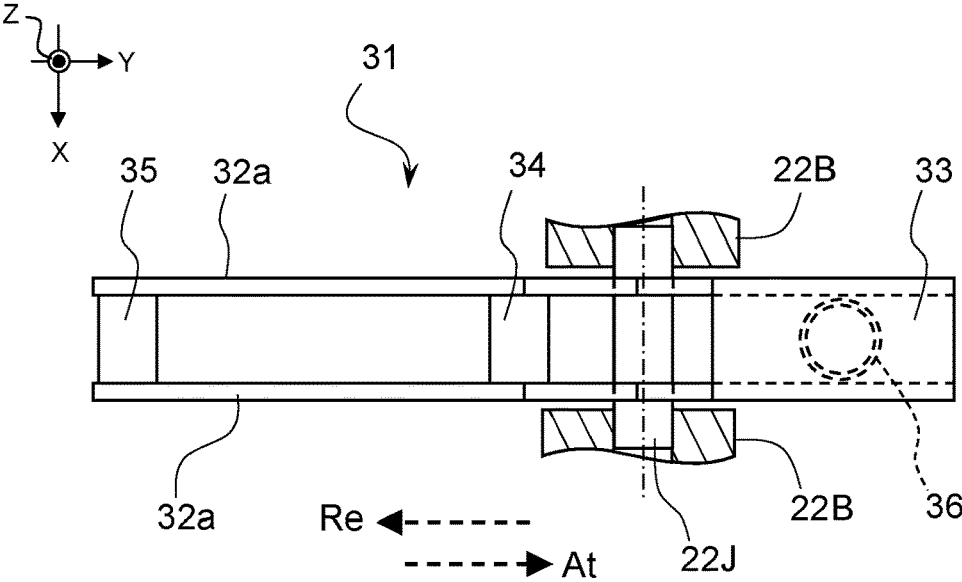
FIG. 5B is a plan view of the fixing mechanism included in the component mounting machine according to the exemplary embodiment of the present disclosure.

In FIGS. 3 and 4, a plurality of supports 22B are provided at a rear end of feeder base 22 at intervals along the X axis. The plurality of supports 22B are arranged such that a space sandwiched between adjacent supports 22B is positioned on an extension line of slot groove 23S. In the space sandwiched between adjacent supports 22B, fixing mechanism 31 is provided in the arrangement corresponding to each slot groove 23S. FIG. 5A is a perspective view of fixing mechanism 31. FIG. 5B is a plan view of fixing mechanism 31. As illustrated in FIGS. 5A and 5B, fixing mechanism 31 includes arm 32 and biasing spring 36 extending in the Y-axis direction as a whole. Support shaft 22J extending along the X axis passes through an intermediate portion of arm 32. Both ends of support shaft 22J are supported by supports 22B, and arm 32 is supported in the space sandwiched between supports 22B. Accordingly, arm 32 is supported by support 22B in a state of being swingable about support shaft 22J.

Arm 32 includes a pair of frames 32a, operated portion 35 coupling rear ends of the pair of frames 32a, stator 34 provided by coupling intermediate portions of the pair of frames 32a, and receiver 33 coupling front portions of the pair of frames 32a. Arm 32 includes stator 34 at a position separated rearward from support shaft 22J, and operated portion 35 at a position further separated rearward from stator 34. That is, operated portion 35 is positioned at a position farther from support shaft 22J than stator 34. Stator 34 and operated portion 35 are constituted by a pin having a smooth surface or a roller (bearing) rotatable about an axis along the X axis.

In FIGS. 5A and 5B, biasing spring 36 of fixing mechanism 31 is mounted on first member 25A of bracket 25, and biases receiver 33 of arm 32 upward. In a state where part feeder 13 is not inserted into slot groove 23S, arm 32 is swung by biasing spring 36, and is stationary at a position where receiver 33 comes into contact with the lower surface of feeder base 22. As described above, in the present exemplary embodiment, fixing mechanism 31 includes arm 32 that swings about an axis (support shaft 22J) horizontally intersecting one direction (mounting direction At) and extends from the axis in unmounting direction Re opposite to one direction. Arm 32 includes stator 34 at a position separated from the axis in the unmounting direction, and operated portion 35 as a cam follower at a position separated from stator 34 in unmounting direction Re. Operated portion 35 is attached to a position at a larger distance from support shaft 22J as a swing fulcrum of fixing mechanism 31 than stator 34.

Figure 2A:
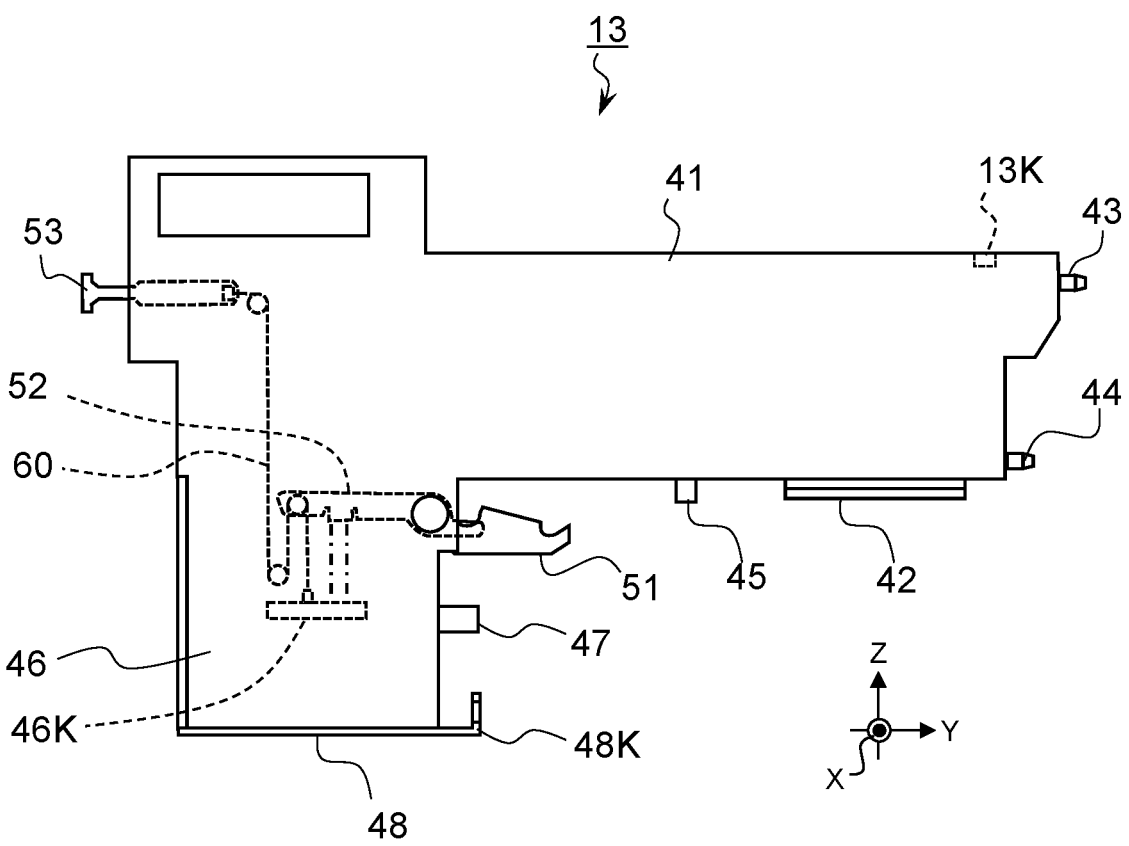
FIG. 2A is a side view of a part feeder according to the exemplary embodiment of the present disclosure.
Figure 2B:
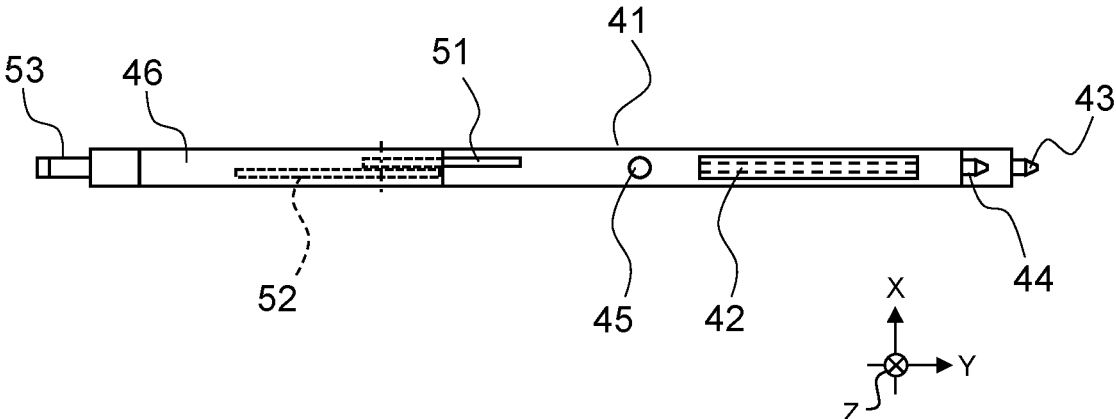
FIG. 2B is a bottom view of the part feeder according to the exemplary embodiment of the present disclosure.

Next, a configuration of part feeder 13 will be described. FIG. 2A is a side view of part feeder 13. FIG. 2B is a bottom view of part feeder 13. In FIGS. 2A and 2B, part feeder 13 includes body 41 having an L shape along a YZ plane as a whole. Body 41 has component supply port 13K described above in the upper portion near the distal end, and includes a component supply mechanism (not illustrated) that supplies component BH to component supply port 13K therein. A portion of a rear portion of body 41 protruding downward is coupling portion 46. An example of part feeder 13 may be a tape feeder including a component supply mechanism that conveys a carrier tape storing components, or a bulk feeder including a component supply mechanism that conveys components stored in a cassette in a line.

In FIGS. 2A and 2B, upper pin 43 and lower pin 44 as first engaging portions are provided at a distal end of body 41 to protrude forward. Upper pin 43 is provided at an upper portion of a front end of body 41, and lower pin 44 is provided at a lower portion of the front end of body 41.

Slot insertion portion 42 and engagement protrusion 45 are provided on a front lower surface of body 41. Slot insertion portion 42 has a shape (an inverted T-shaped cross section) that can be inserted into first slot groove 23SA provided in feeder base 22. Slot insertion portion 42 is inserted from a rear side of first slot groove 23SA, and body 41 is pushed until the front end thereof comes into contact with feeder stopper 24 provided in feeder base 22. FIG. 7A illustrates a cross section of slot insertion portion 42 inserted into first slot groove 23SA together with feeder base 22. Width direction dimension W1 of an upper end of slot insertion portion 42 is narrower than groove width MH1 of first slot groove 23SA, but width W2 of a lower end is wider than groove width MH1, and a cross-sectional shape thereof is a shape that fits within the inverted T-shaped cross section of first slot groove 23SA.

In FIGS. 2A and 2B, engagement protrusion 45 has a shape that can be inserted into second slot groove 23SB provided in feeder base 22. In the present exemplary embodiment, an outer diameter shape of engagement protrusion 45 as viewed from below is a cylindrical pin, and is provided to protrude downward from body 41. Engagement protrusion 45 is positioned on an extension line of slot insertion portion 42, that is, on a center line of slot insertion portion 42 along the Y axis. When slot insertion portion 42 is inserted into first slot groove 23SA, engagement protrusion 45 is inserted into second slot groove 23SB while being guided by the insertion portion.

FIG. 7B is an XZ sectional view illustrating a state where engagement protrusion 45 is inserted into second slot groove 23SB. Dimension D (diameter D) of engagement protrusion 45 in a groove width direction is smaller than groove width MH2 of second slot groove 23SB by a tolerance of "clearance fit". Accordingly, engagement protrusion 45 is slidable along the Y axis in second slot groove 23SB, but is restrained in the direction along the X axis. Engagement protrusion 45 comes into contact with the upper surface of feeder base 22 (the upper surface of the slot) between second slot forming members 23B. When part feeder 13 is fixed to feeder base 22 by fixing mechanism 31, a downward force by fixing mechanism 31 acts on part feeder 13, but most of the force is concentrated on a narrow contact surface where engagement protrusion 45 and feeder base 22 are in contact with each other. As a result, since engagement protrusion 45 is pushed against feeder base 22 with a strong force, part feeder 13 is firmly fixed to feeder base 22.

In FIG. 2A, plug 47 forming a connector for electric wiring with fixed member 51 is provided to protrude forward at coupling portion 46. When body 41 is attached to feeder base 22, plug 47 is connected to socket 26 (see FIG. 4) provided on feeder base 22 side.

Figure 6A:
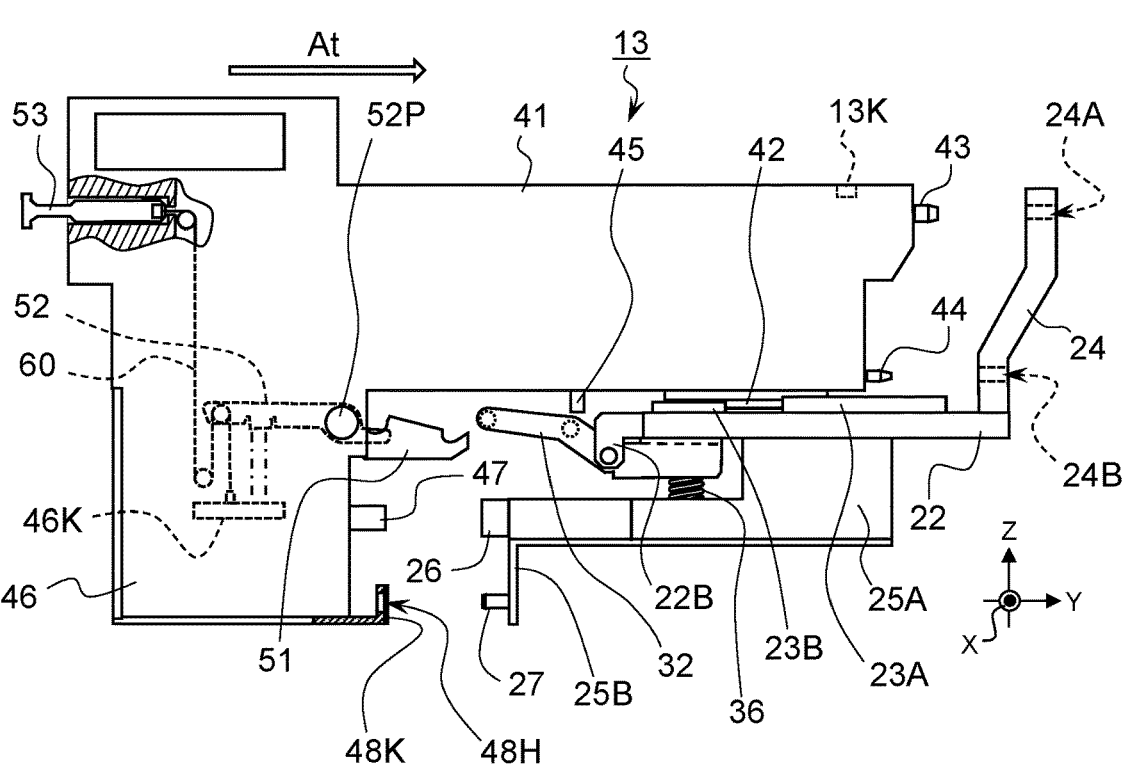
FIG. 6A is an explanatory diagram before and after the part feeder is mounted on the feeder base included in the component mounting machine according to the exemplary embodiment of the present disclosure.
Figure 6B:
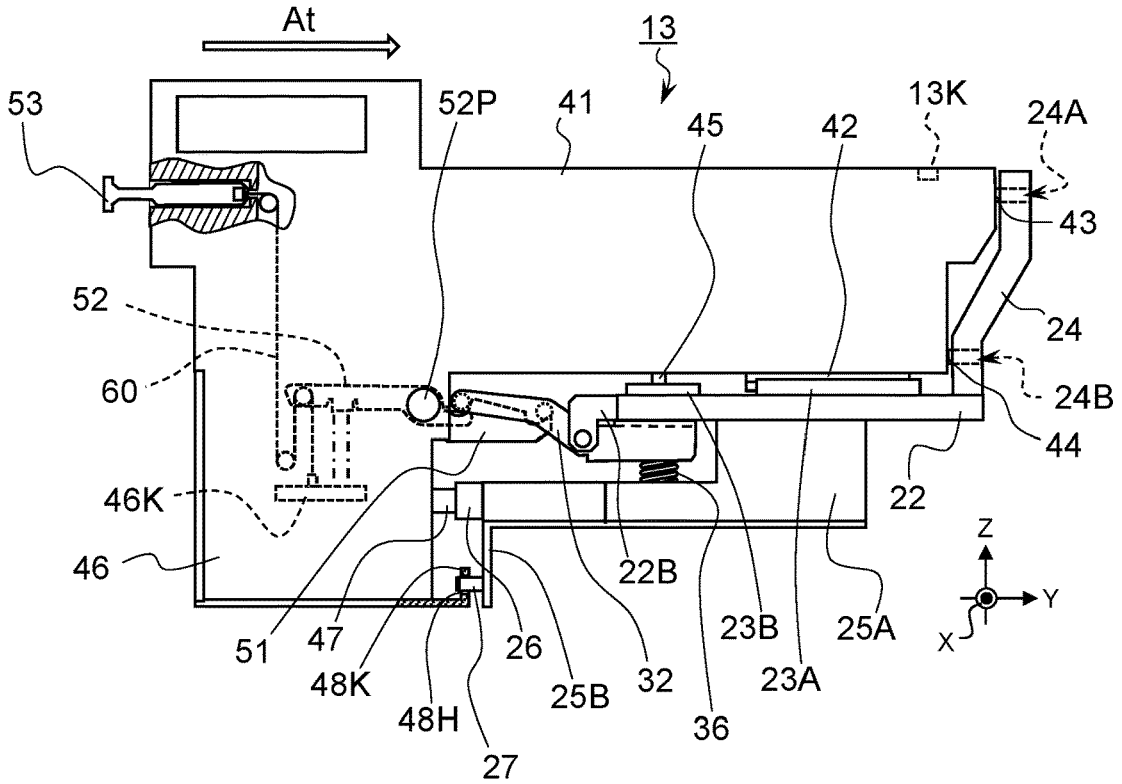
FIG. 6B is an explanatory diagram before and after the part feeder is mounted on the feeder base included in the component mounting machine according to the exemplary embodiment of the present disclosure.

In FIG. 2A, bottom plate 48 having a shape extending in the front-rear direction is attached to a lower end of coupling portion 46, that is, a position below fixed member 51. A distal end of bottom plate 48 is bent portion 48K bent upward, and engagement hole 48H including an opening is provided at a center of bent portion 48K as illustrated in FIG. 3. FIGS. 6A and 6B are explanatory diagrams before and after part feeder 13 is mounted on feeder base 22 included in component mounting machine 1. As illustrated in FIG. 6B, when slot insertion portion 42 is inserted to a back side of first slot groove 23SA, engagement pin 27 is inserted into and engaged with engagement hole 48H.

Figure 8:
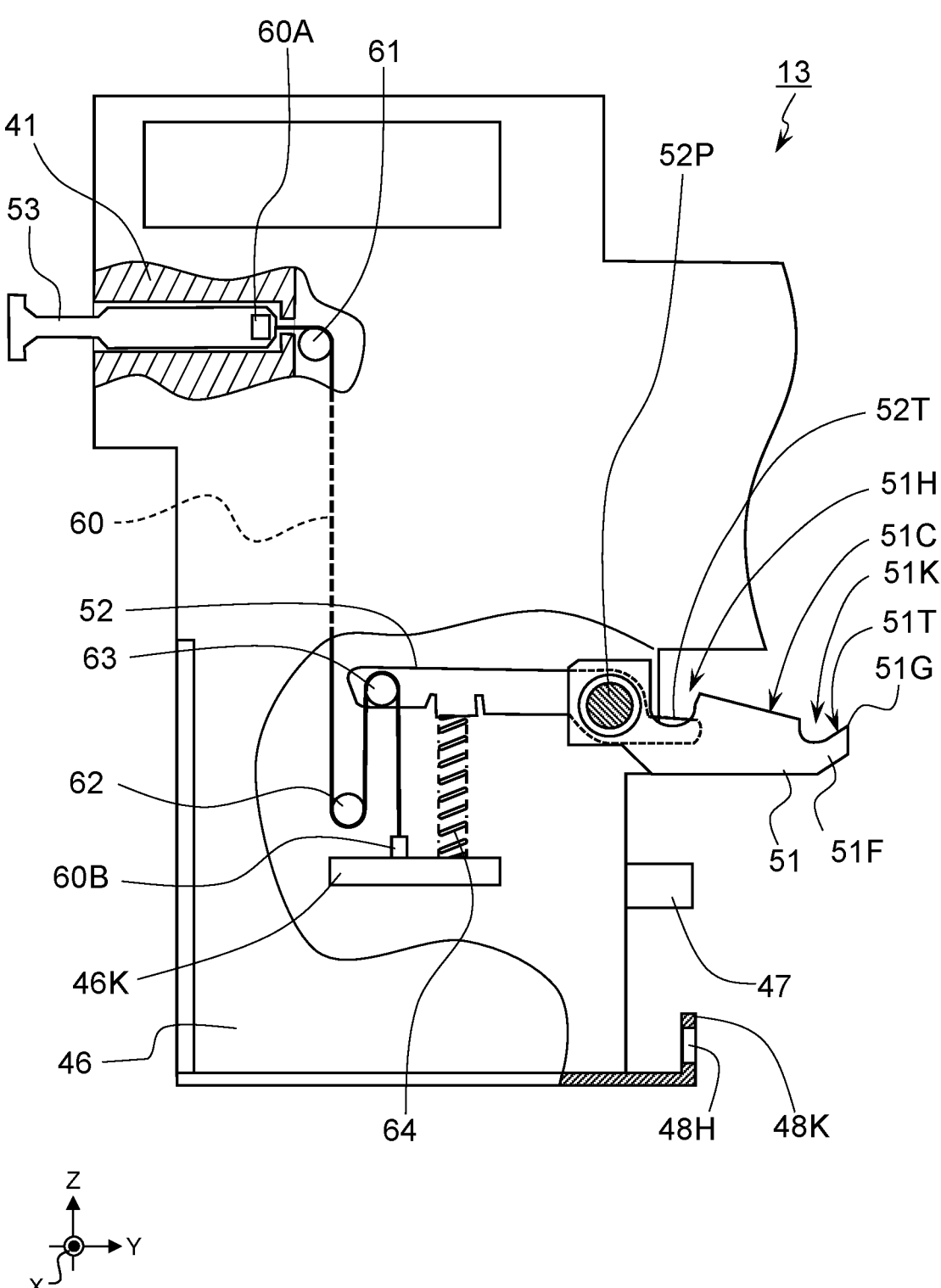
FIG. 8 is an explanatory diagram of a transmission mechanism of the part feeder according to the exemplary embodiment of the present disclosure.
Figure 9:
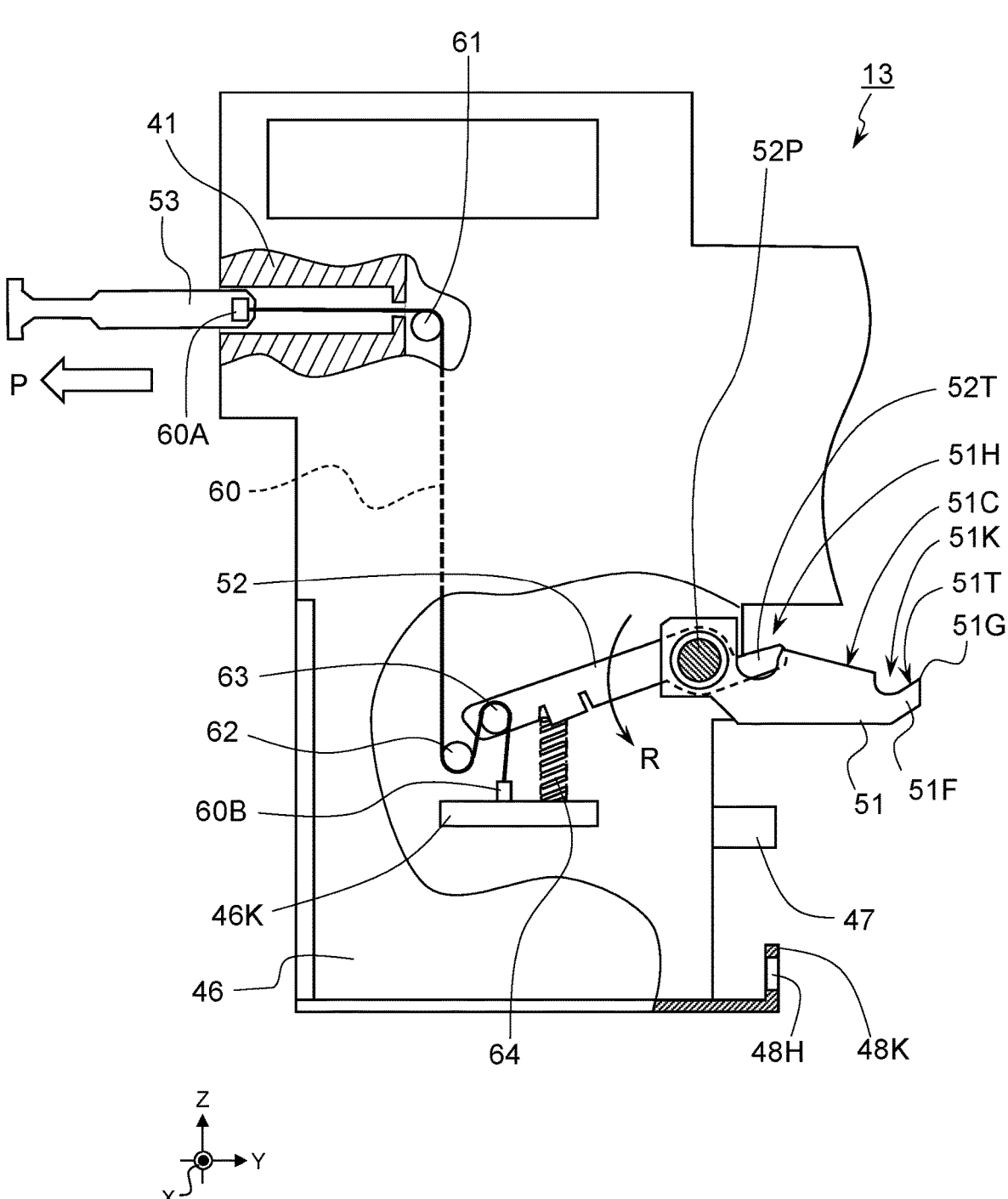
FIG. 9 is an explanatory diagram of a transmission mechanism of the part feeder according to the exemplary embodiment of the present disclosure.
Figure 10:
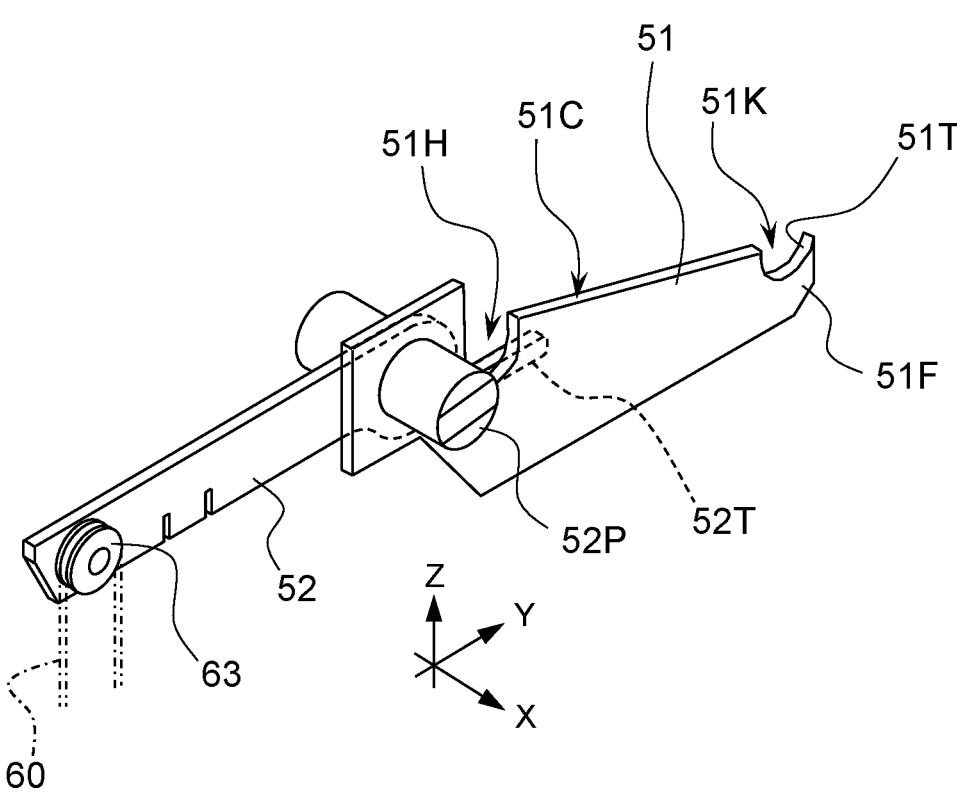
FIG. 10 is a perspective view of a fixed member and an unclamping member included in the part feeder according to the exemplary embodiment of the present disclosure.

FIGS. 8 and 9 are explanatory diagrams of a transmission mechanism of part feeder 13. In FIGS. 2A, 2B, 8, and 9, fixed member 51 is provided in coupling portion 46 of body 41. Fixed member 51 has a shape extending along the Y axis as a whole. A rear end side of fixed member 51 is fixed to body 41, and a front end side protrudes forward from coupling portion 46.

Recess 51K opened upward is provided in distal end 51F of fixed member 51. As illustrated in FIG. 8, recess 51K has inclined surface 51T inclined upward toward a distal end. Clearance 51H having a shape opened upward is provided at a position separated rearward from recess 51K of fixed member 51. An upper edge from recess 51K to clearance 51H is cam surface 51C having an inclined shape that is an upward slope from recess 51K toward clearance 51H.

In FIGS. 8 and 9, unclamping member 52 is provided in coupling portion 46. Unclamping member 52 is supported by pin 52P having both ends attached to coupling portion 46 and extending along the X-axis, and is swingable around pin 52P. Unclamping claw 52T protruding forward from pin 52P is provided at a distal end of unclamping member 52. Unclamping member 52 is adjacent to fixed member 51 in the direction along the X-axis, and a position of unclamping claw 52T is positioned substantially right beside clearance 51H. A rear end of unclamping member 52 is positioned behind pin 52P, and third pulley 63 to be described later is mounted thereon.

In FIGS. 8 and 9, operation member 53 is provided at a rear end of body 41. Operation member 53 is provided to be movable in the front-rear direction with respect to body 41. A rear portion of operation member 53 protrudes rearward from a rear end of body 41. Operation member 53 is movable between a front position (FIG. 8) in body 41 and a rear position (FIG. 9) moved rearward in body 41 from the front position. Operation member 53 is positioned at the front position by coming into contact with the front contact portion (not illustrated) provided in body 41 from the rear, and is positioned at the rear position by coming into contact with a rear contact portion (not illustrated) provided in body 41 from the front.

In FIGS. 8 and 9, wire 60 that couples operation member 53 and fixed member 51 is provided in body 41. One end of wire 60 is attached to operation member 53 with upper wire fixing portion 60A interposed therebetween, and the other end of wire 60 is attached to wire fixing portion 46K fixed to coupling portion 46 with lower wire fixing portion 60B interposed therebetween.

In FIGS. 8 and 9, an intermediate portion of wire 60 is supported by a plurality of pulleys (first pulley 61, second pulley 62, and third pulley 63). First pulley 61 is attached to an upper portion of body 41, and second pulley 62 is attached to coupling portion 46. Third pulley 63 is attached to the rear end of unclamping member 52. First pulley 61 and second pulley 62 are mounted in a state where positions thereof are fixed to coupling portion 46, whereas third pulley 63 vertically changes the positions thereof together with the swing of unclamping member 52. Wire 60 extends forward from upper wire fixing portion 60A to first pulley 61 and is bent downward by first pulley 61. Wire 60 bent downward by first pulley 61 is bent upward by second pulley 62, is bent downward by third pulley 63, and reaches lower wire fixing portion 60B.

In FIGS. 8 and 9, spring member 64 is installed in wire fixing portion 46K. Spring member 64 constantly biases the rear end of unclamping member 52 upward. Thus, unclamping member 52 swings to a position at which wire 60 is fully extended by third pulley 63 and stops. When operation member 53 is at the front position as illustrated in FIG. 8, unclamping member 52 is substantially horizontal, and unclamping claw 52T at the distal end is positioned at a position (standby position) substantially equal to or lower than a bottom surface of clearance 51H of fixed member 51. When operation member 53 is at the rear position as illustrated in FIG. 9, unclamping member 52 is pulled by wire 60 and swings in a direction indicated by arrow R. As a result, an upper surface of unclamping claw 52T of unclamping member 52 moves to a position (unclamping position) higher than cam surface 51C. Since the operation member is pulled by wire 60 by the action of spring member 64 and is drawn into body 41, operation member 53 is constantly positioned at the front position, and moves to the rear position when an operation of being pulled rearward by operator OP is received.

When operator OP performs the operation of pulling operation member 53 rearward from a state where operation member 53 is positioned at the front position as described above (arrow P illustrated in FIG. 9), upper wire fixing portion 60A moves rearward. As a result, wire 60 between first pulley 61 and second pulley 62 is pulled up, and the rear end of unclamping member 52 is pulled downward by wire 60 with third pulley 63 interposed therebetween. Thus, unclamping member 52 swings with pin 52P as a fulcrum while compressing spring member 64 (arrow R illustrated in FIG. 9), and unclamping claw 52T at the distal end moves from the standby position to the unclamping position. In the present exemplary embodiment, wire 60 is a transmission mechanism that transmits the displacement of operation member 53 that is displaced by receiving an external force in a direction opposite to the one direction to unclamping member 52 that is an unfixing member. Other mechanical elements such as a link may be used in addition to wire 60 as the transmission mechanism.

When part feeder 13 having such a configuration is attached to feeder base 22, operator OP inserts a distal end of slot insertion portion 42 into slot groove 23S in a state where operation member 53 is positioned at the front position (state where operation member 53 is not operated). Part feeder 13 is slid in mounting direction At (arrow At in FIG. 6A) along slot groove 23S, and body 41 is pushed into the back side of feeder base 22 until the distal end of body 41 comes into contact with feeder stopper 24 (FIG. 6A→FIG. 6B). As a result, fixed member 51 of part feeder 13 is fixed by fixing mechanism 31 (see FIGS. 11A to 11D) provided in feeder base 22. Upper pin 43 of part feeder 13 fixed to feeder base 22 is fitted into upper pin insertion hole 24A of feeder stopper 24, and lower pin 44 is fitted into lower pin insertion hole 24B. Engagement protrusion 45 is inserted into second slot groove 23SB (see FIG. 7B), and engagement pin 27 on feeder base 22 side is inserted into and engaged with engagement hole 48H on part feeder 13 side.

Engagement hole 48H is a second engaging portion in the present exemplary embodiment. Here, the "second engaging portion" refers to a portion that is provided at a position behind slot insertion portion 42 of body 41 and is engaged with a member (engagement pin 27 in the present exemplary embodiment) positioned below the upper surface of feeder base 22 in a state where slot insertion portion 42 is inserted into slot groove 23S.

By sliding part feeder 13 in mounting direction At, plug 47 of part feeder 13 is fitted into socket 26 provided on feeder base 22 side, and part feeder 13 and control device 17 of component mounting machine 1 are electrically connected. As a result, an operation of part feeder 13 can be controlled by control device 17.

Figure 11A:
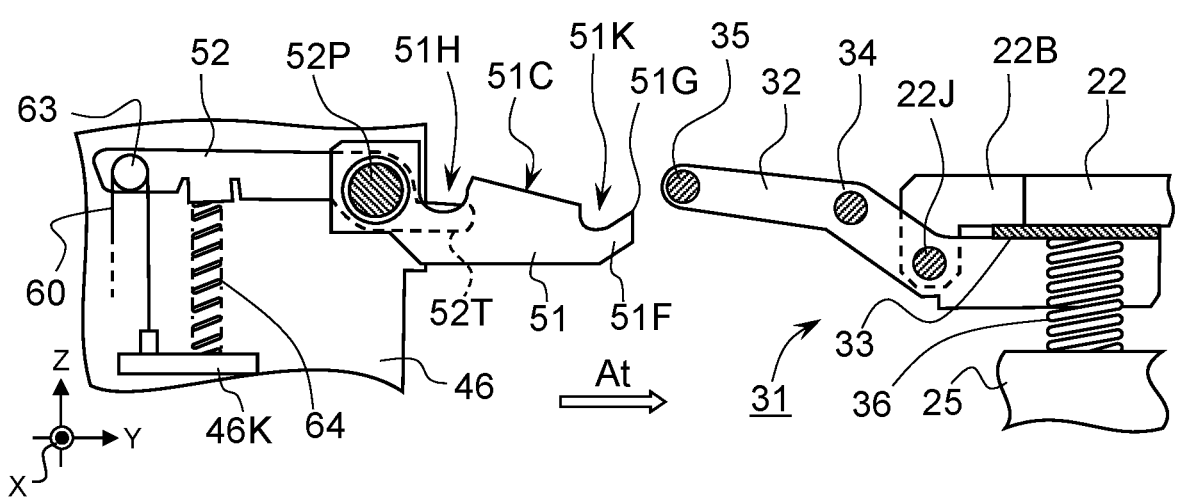
FIG. 11A is an operation explanatory diagram of the fixing mechanism when the part feeder according to the exemplary embodiment of the present disclosure is mounted on the feeder base.
Figure 11B:
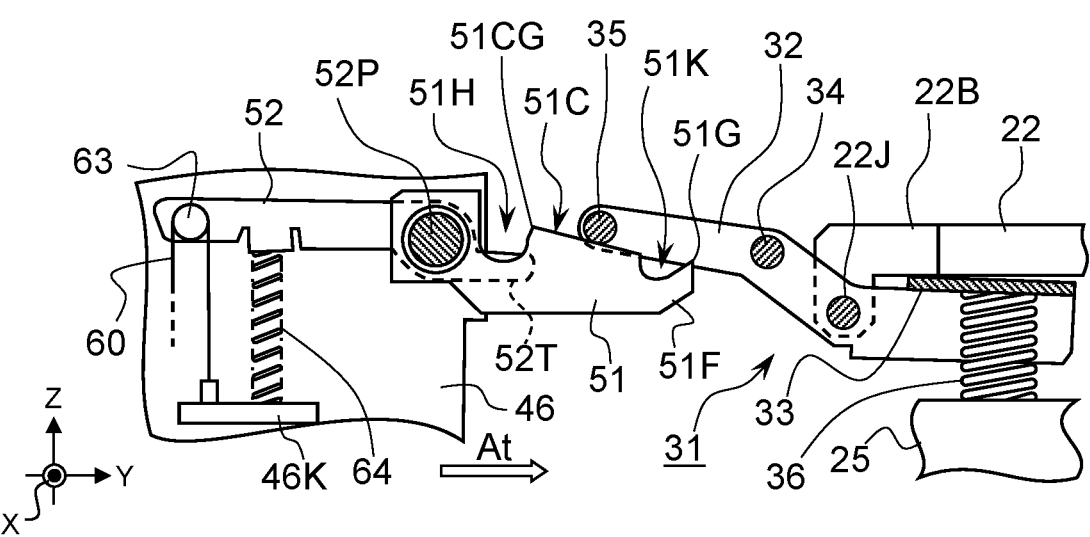
FIG. 11B is an operation explanatory diagram of the fixing mechanism when the part feeder according to the exemplary embodiment of the present disclosure is mounted on the feeder base.
Figure 11C:
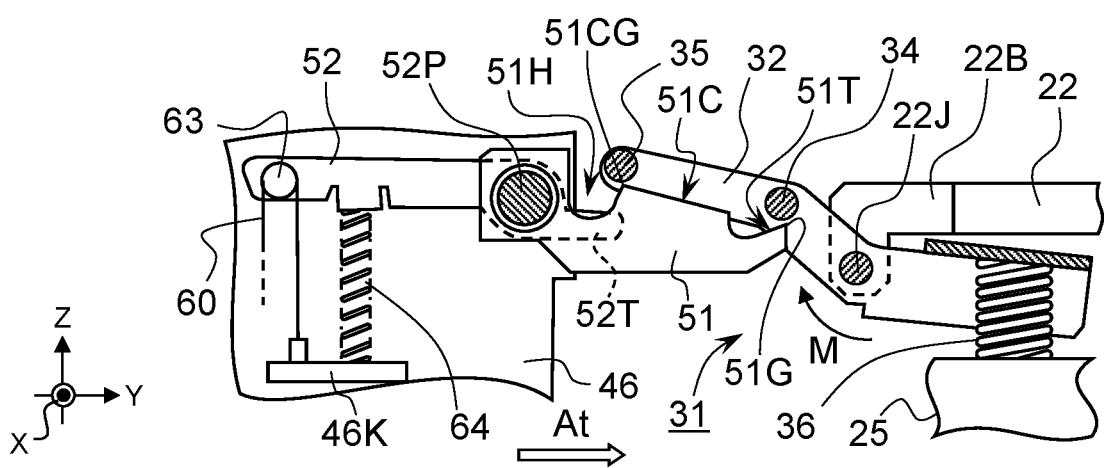
FIG. 11C is an operation explanatory diagram of the fixing mechanism when the part feeder according to the exemplary embodiment of the present disclosure is mounted on the feeder base.

Next, a fixing operation of fixed member 51 by fixing mechanism 31 will be described with reference to FIGS. 11A to 11D. FIGS. 11A to 11D are explanatory diagrams of the operation of the fixing mechanism when the part feeder according to the exemplary embodiment of the present disclosure is mounted on the feeder base. When slot insertion portion 42 of part feeder 13 is inserted into a back side of slot groove 23S of feeder base 22, cam surface 51C of fixed member 51 included in part feeder 13 comes into contact with operated portion 35 of fixing mechanism 31 (FIG. 11A→FIG. 11B). Since highest point 51G of distal end 51F of fixed member 51 passes through a position lower than operated portion 35, cam surface 51C first comes into contact with operated portion 35 of fixing mechanism 31. When part feeder 13 further slides in mounting direction At from this state, cam surface 51C moves while pushing up operated portion 35 due to an inclined surface shape thereof. As a result, arm 32 swings around support shaft 22J against the biasing force of biasing spring 36 (arrow M in FIG. 11C). When arm 32 is pushed up and swung by cam surface 51C, stator 34 also moves upward. When highest point 51CG at a rear end of cam surface 51C reaches directly below operated portion 35, highest point 51G of distal end 51F reaches a position directly below stator 34 or slightly passed through a center of stator 34 in mounting direction At (FIG. 11C).

Figure 11D:
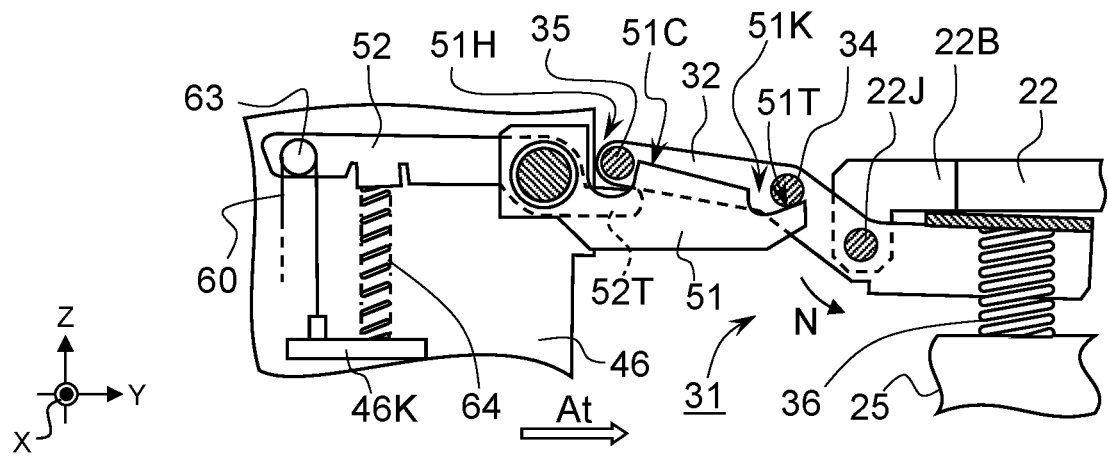
FIG. 11D is an operation explanatory diagram of the fixing mechanism when the part feeder according to the exemplary embodiment of the present disclosure is mounted on the feeder base.

When part feeder 13 inserted into slot groove 23S further moves in mounting direction At and the distal end thereof comes into contact with feeder stopper 24, clearance 51H of fixed member 51 reaches directly below operated portion 35 and recess 51K also reaches directly below stator 34. At this time, operated portion 35 that has not supported by cam surface 51C falls to clearance 51H, and thus, arm 32 swings in an opposite direction about support shaft 22J (arrow N in FIG. 11D). Stator 34 descends along with the swinging of arm 32, and is pushed against recess 51K that has moved directly below the arm (FIG. 11D). As a result, fixing mechanism 31 engages (clamps) stator 34 with fixed member 51 to fix part feeder 13 to feeder base 22 (FIG. 6B).

As described above, the component mounting machine according to the present exemplary embodiment can fix part feeder 13 to feeder base 22 only by inserting slot insertion portion 42 of part feeder 13 into slot groove 23S of feeder base 22 and moving the part feeder in mounting direction At. Fixing mechanism 31 includes strong biasing spring 36 that exerts a sufficient clamping force for fixing part feeder 13, and when part feeder 13 is fixed to feeder base 22, it is necessary to operate fixing mechanism 31 against biasing spring 36 by a member of part feeder 13. In order to achieve this, in the present exemplary embodiment, cam surface 51C for operating fixing mechanism 31 is provided in fixed member 51 provided in part feeder 13.

Here, fixing mechanism 31 includes stator 34 and operated portion 35, which are mounted on arm 32 that swings about an axis (pin 52 P) horizontally intersecting one direction (mounting direction At). Arm 32 extends in unmounting direction Re opposite to the one direction, and includes stator 34 at a position separated from pin 52P in unmounting direction Re and operated portion 35 at a position separated from stator 34 in the unmounting direction. Fixed member 51 pushes up operated portion 35 with cam surface 51C. Cam surface 51C is an inclined surface that rises in unmounting direction Re, and displaces operated portion 35 upward when fixed member 51 moves in one direction (mounting direction At). That is, stator 34 is not directly pushed up by cam surface 51C, but is indirectly pushed up by operating operated portion 35. As described above, since a distance from support shaft 22J is larger at an attachment position of operated portion 35 than at an attachment position of stator 34, fixed member 51 can push up stator 34 to a height at which stator 34 does not interfere with highest point 51G of distal end 51F of fixed member 51 with a smaller force than when the stator is directly pushed up. A reaction force from fixing mechanism 31 when part feeder 13 is pushed into feeder base 22 can be reduced in cooperation with a boosting action by cam surface 51C. In other words, a pushing force when pushing part feeder 13 into feeder base 22 can be reduced.

In a state where fixed member 51 is clamped by stator 34 as described above, not only the first engaging portions (upper pin 43 and lower pin 44) provided at the distal end of body 41 are engaged with the first engaged portions (feeder stopper 24) on feeder base 22 side, but also engagement holes 48H as the second engaging portions are engaged with the second engaged portions (engagement pins 27) (FIGS. 6A and 6B). The lateral swing of component supply port 13K (component extraction position) is effectively suppressed by arranging the first engaged portion and the second engaged portion in a positional relationship in which the upper surface of feeder base 22 is vertically sandwiched between the first engaged portion and the second engaged portion and engaging the first engaging portion and the second engaging portion of part feeder 13 with the first engaging portion and the second engaging portion.

In a state where fixed member 51 is clamped by stator 34, engagement protrusion 45 is engaged with slot groove 23S. As described above, since diameter D of engagement protrusion 45 is small by a predetermined tolerance with respect to groove width MH2 of second slot groove 23SB, rattling in a lateral direction is at a level with no problem. Thus, the lateral swing of part feeder 13 is also effectively suppressed by engagement protrusion 45. Since engagement protrusion 45 is strongly pushed against the upper surface of the slot (the upper surface of feeder base 22 in the present exemplary embodiment) by a force of stator 34 pressing fixed member 51 downward, a stable mounting state can be maintained.

As described above, in the present exemplary embodiment, part feeder 13 attached to feeder base 22 has extremely high rigidity against lateral swinging. Thus, even when mounting head 14 is frequently moved and stopped during the operation of component mounting machine 1 and part feeder 13 is accordingly excited with a large excitation force, the lateral swing of part feeder 13 is suppressed, and an amplitude of the lateral swing of component supply port 13K can be suppressed.

Figure 12A:
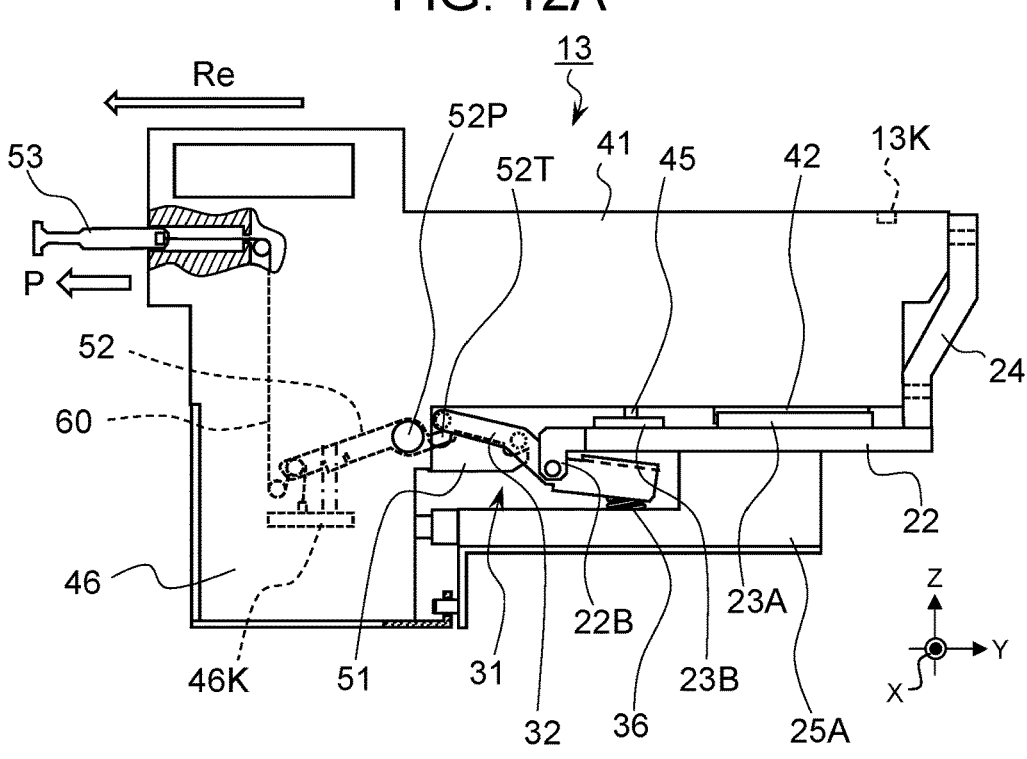
FIG. 12A is an explanatory diagram before and after the part feeder is detached from the feeder base included in the component mounting machine according to the exemplary embodiment of the present disclosure.
Figure 12B:
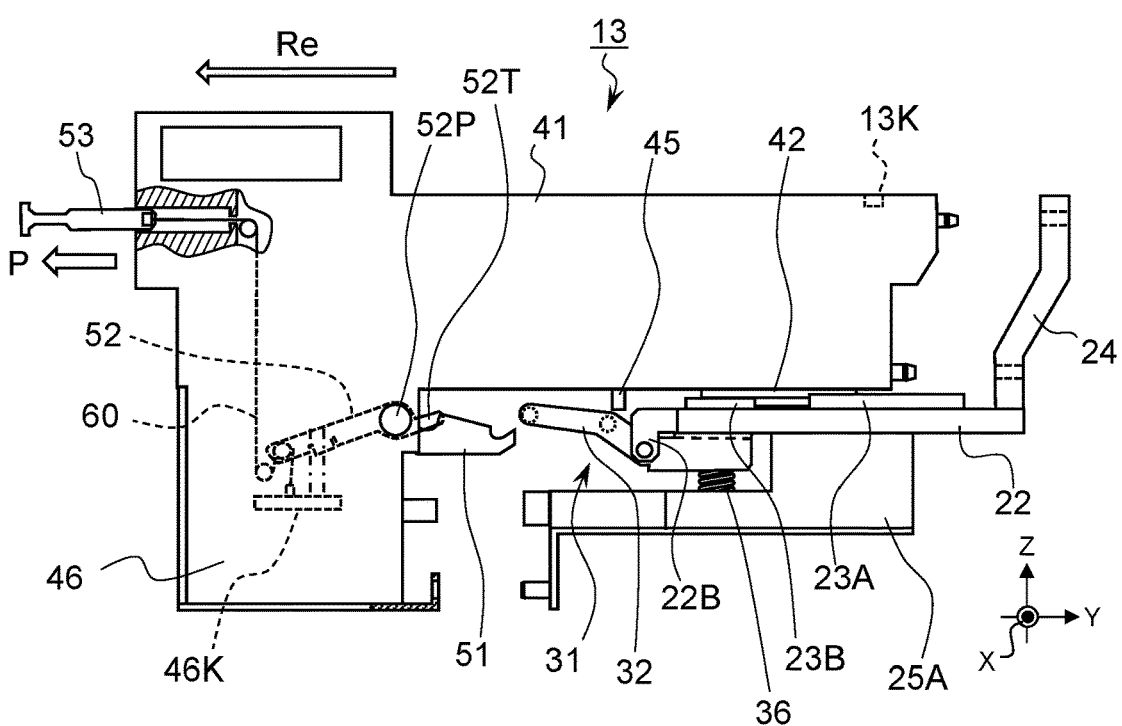
FIG. 12B is an explanatory diagram before and after the part feeder is detached from the feeder base included in the component mounting machine according to the exemplary embodiment of the present disclosure.
Figure 13A:
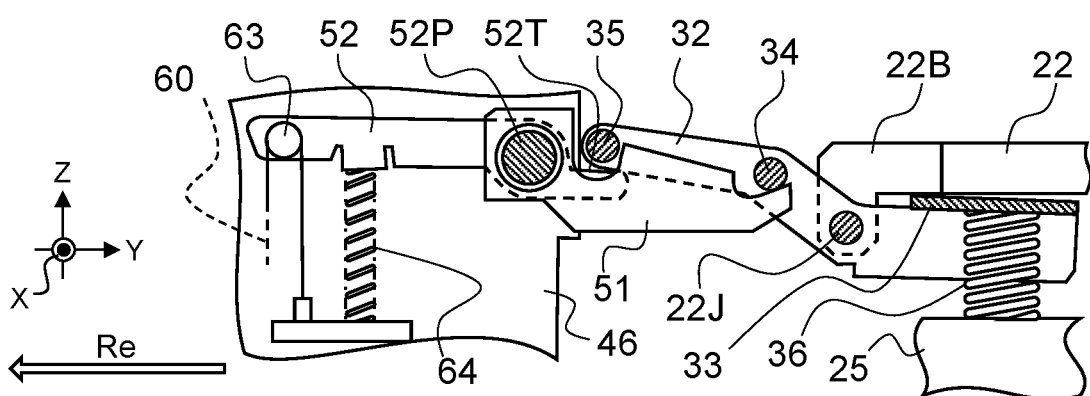
FIG. 13A is an explanatory diagram of an unfixing operation by an unfixing member when the part feeder according to the exemplary embodiment of the present disclosure is detached from the feeder base.
Figure 13B:
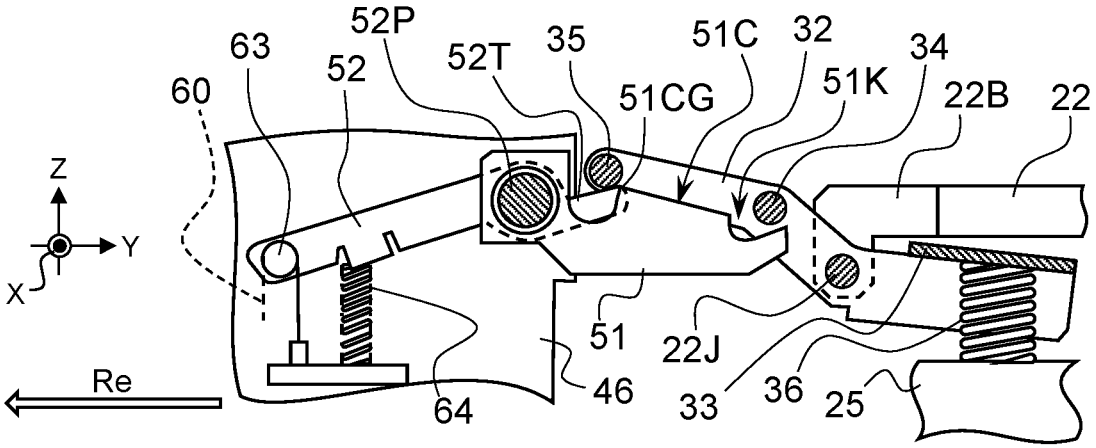
FIG. 13B is an explanatory diagram of the unfixing operation by the unfixing member when the part feeder according to the exemplary embodiment of the present disclosure is detached from the feeder base.
Figure 13C:
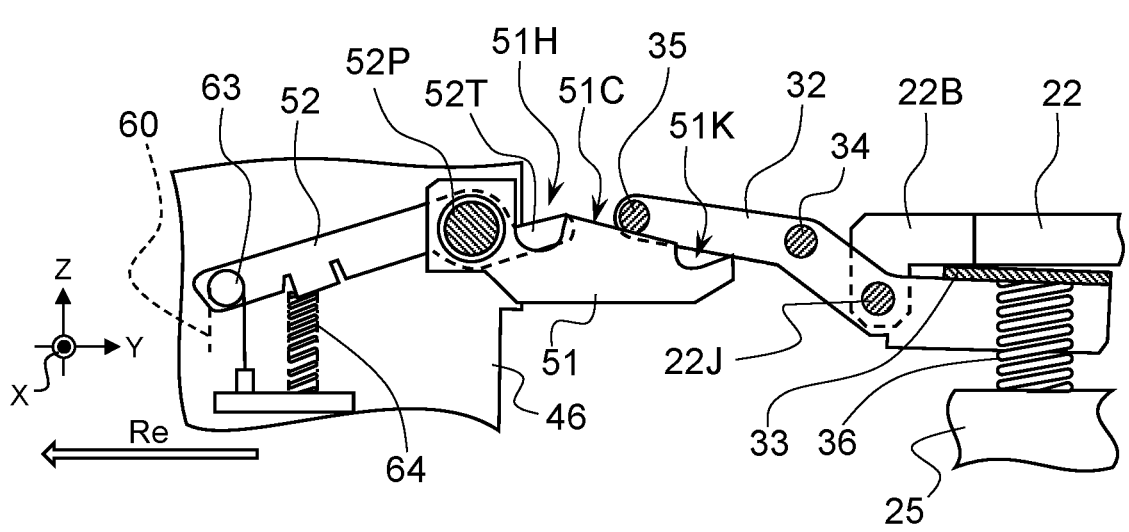
FIG. 13C is an explanatory diagram of the unfixing operation by the unfixing member when the part feeder according to the exemplary embodiment of the present disclosure is detached from the feeder base.

FIGS. 12A and 12B are explanatory diagrams before and after part feeder 13 is detached from feeder base 22. FIGS. 13A to 13D are explanatory diagrams of an unfixing operation by unclamping member 52 which is an unfixing member when part feeder 13 is detached from feeder base 22. When part feeder 13 attached to feeder base 22 is detached, operator OP performs the operation of pulling operation member 53 rearward (in unmounting direction Re) (arrow P illustrated in FIGS. 9 and 12A). As a result, operation member 53 moves from the front position to the rear position, and unclamping member 52 swings in a direction of lowering the rear end side through wire 60 (FIG. 13A→FIG. 13B). Thus, operated portion 35 in clearance 51H is pushed up by unclamping claw 52T, and is lifted to be equal to or higher than highest point 51CG of cam surface 51C adjacent to clearance 51H (FIG. 13B). Along with this, stator 34 is unmounted from recess 51K, and the clamping state by stator 34 is released. Unclamping member 52 functions as the unfixing member that performs the unfixing operation of operating fixing mechanism 31. Unclamping member 52 performs the unfixing operation of the displacement (arrow P illustrated in FIGS. 9 and 12B) of operation member 53 which is displaced by receiving the external force in unmounting direction Re in the direction opposite to one direction in conjunction with wire 60 (transmission mechanism), that is, an operation of unfixing by detaching stator 34 from recess 51K.

As described above, unclamping member 52 of part feeder 13 according to the present exemplary embodiment is activated by the pulling operation of operation member 53 to separate stator 34 to which fixed member 51 is fixed from fixed member 51. Specifically, operation member 53 and unclamping member 52 are coupled by wire 60, and when operation member 53 is pulled rearward of body 41, unclamping member 52 swings to separate stator 34 from fixed member 51. In such a configuration, it is easy to convert the direction of the force by using wire 60, and the mechanism for activating unclamping member 52 by operation member 53 can have a light weight and a compact size.

Figure 13D:
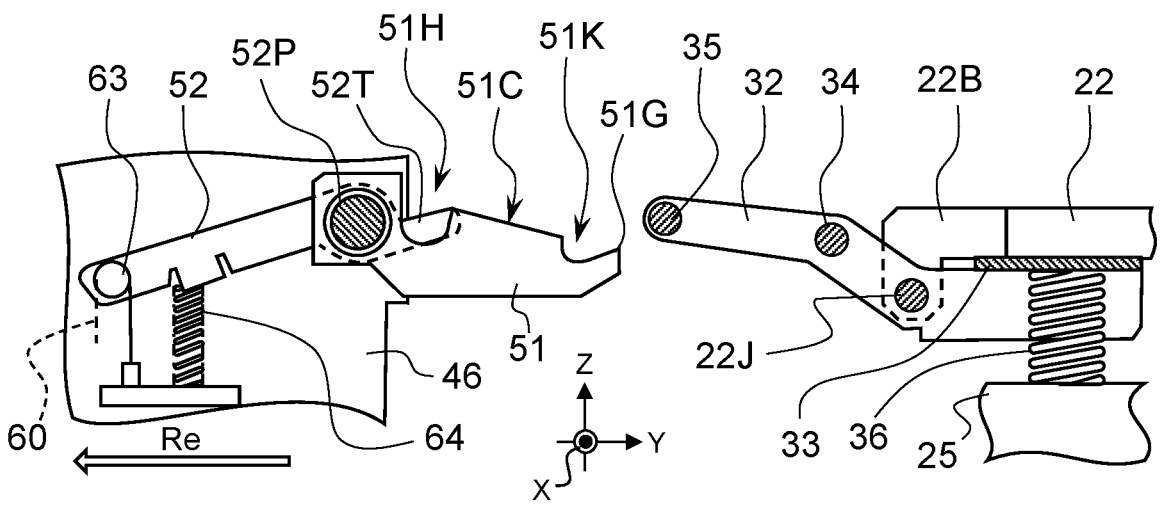
FIG. 13D is an explanatory diagram of the unfixing operation by the unfixing member when the part feeder according to the exemplary embodiment of the present disclosure is detached from the feeder base.

Operator OP performs the operation of pulling operation member 53 rearward and continues to pull operation member 53 rearward of body 41 even after the clamping of stator 34 by fixed member 51 is released. As a result, since slot insertion portion 42 moves rearward and comes out of feeder base 22, part feeder 13 can be detached from feeder base 22. During this time, recess 51K of fixed member 51 is separated from below stator 34 in unmounting direction Re. On the other hand, operated portion 35 moves along cam surface 51C of fixed member 51 (FIG. 13B→FIG. 13C) and is separated from cam surface 51C (FIG. 13D).

As described above, in part feeder 13 according to the present exemplary embodiment, when operation member 53 is pulled rearward of body 41 and unclamping member 52 activates to release the clamping of stator 34 by fixed member 51 and then operation member 53 is further pulled rearward by body 41, slot insertion portion 42 comes out of slot groove 23S by the pulling force. When the part feeder of the related art disclosed in PTL 1 is detached from the feeder base, since the operator needs to perform an operation of operating the operation member in a vertical direction and an operation of pulling out the part feeder from the feeder base in a horizontal direction, there is a problem of poor work efficiency. In recent years, for the purpose of labor saving, it has been studied to detach the part feeder from the feeder base by a robot. However, in this case, in addition to an operation shaft for causing the robot to move the part feeder in the horizontal direction, an operation shaft for operating the above-described lever-shaped operation member in the vertical direction is required. By doing this, a structure and an operation of the robot become complicated, and there is a concern that cost increases. On the other hand, in the present exemplary embodiment, operator OP can smoothly perform both the unfixing operation and the detaching operation of part feeder 13 by the operation of pulling operation member 53 in unmounting direction Re.

As described above, in part feeder 13 (and component mounting machine 1) according to the present exemplary embodiment, when slot insertion portion 42 provided in body 41 is inserted into slot groove 23S of feeder base 22, fixed member 51 is clamped by stator 34 of fixing mechanism 31 which is a clamped unit provided in feeder base 22 by the operation. When operation member 53 is pulled rearward of body 41, unclamping member 52 is activated by the operation, and fixed member 51 clamped by stator 34 is separated from fixed member 51. As described above, the fixing operation and the unfixing operation of part feeder 13 with respect to feeder base 22 are extremely simple, and an operation direction thereof is unified to a direction in which part feeder 13 slides along the slot. Thus, even when these operations are performed by a robot, these operations are only simple operations, and it is possible to prevent an increase in cost by using an expensive robot that requires a complicated operation.

In part feeder 13 according to the present exemplary embodiment, fixed member 51 does not directly push up stator 34 biased downward, but pushes up operated portion 35 positioned behind stator 34. Thus, stator 34 can be pushed up with a smaller force as a preparation operation for clamping stator 34. Thus, the pushing force when part feeder 13 is pushed into feeder base 22 can be reduced.

While the exemplary embodiment of the present disclosure has been described above, the present disclosure is not limited to the above exemplary embodiment, and various modifications and the like can be made. For example, although the slot is the groove (slot groove 23S) in the above-described exemplary embodiment, the shape of the slot may be a structure (for example, a rail) other than the groove.

INDUSTRIAL APPLICABILITY

It is possible to provide a part feeder and a component mounting machine capable of efficiently performing a replacement operation of the part feeder with respect to a feeder base.

REFERENCE MARKS IN THE DRAWINGS 1 component mounting machine
12 board conveyance path
13 part feeder
13K component supply port (component extraction position)
14 mounting head
22 feeder base
23S slot groove
23SA first slot groove 23SB second slot groove
24 feeder stopper (first engaged portion)
27 engaging pin (second engaged portion)
31 fixing mechanism
34 stator
35 operated portion
41 body
42 slot insertion portion
43 upper pin (first engaging portion)
44 lower pin (first engaging portion)
45 engagement protrusion
48H engagement hole (second engaging portion)
51 fixed member
51K recess
52 unclamping member
53 operation member
60 wire
BH component

The invention claimed is:

1. A part feeder used by being attached to a slot of a feeder base included in a component mounting machine, the part feeder comprising:
   a body that includes a component supply mechanism that supplies a component at a component extraction position at which a mounting head included in the component mounting machine extracts the component;
   a slot insertion portion that is provided at the body, and slides in one direction to be inserted into the slot;
   a fixed member that protrudes in the one direction from the body, and is fixed to a fixing mechanism provided at the feeder base by sliding in the one direction;
   an unfixing member that performs an unfixing operation of operating the fixing mechanism to which the fixed member is fixed to release the fixing of the fixed member by the fixing mechanism;
   an operation member that is displaced by receiving an external force; and
   a transmission mechanism that transmits the displacement of the operation member to the unfixing member to perform the unfixing operation, wherein
   the fixing mechanism includes a stator biased in a push-down direction by an elastic member,
   the fixed member includes a recess opened upward, and
   the fixed member is fixed to the fixing mechanism by the stator coming into contact with the recess from above by an elastic force of the elastic member.

2. The part feeder according to claim 1, wherein the transmission mechanism transmits displacement of the operation member in an unmounting direction opposite to the one direction to the unfixing member to cause the unfixing member to perform the unfixing operation.

3. The part feeder according to claim 1, wherein the transmission mechanism includes at least a wire.

4. The part feeder according to claim 1, further comprising:
   at least one first engaging portion that is provided at a distal end of the body, and is engaged with a first engaged portion provided at a position higher than an upper surface of the feeder base when the slot insertion portion slides in the one direction to be inserted into the slot; and
   at least one second engaging portion that is provided below the fixed member of the body, and is engaged with a second engaged portion provided at a position lower than the upper surface of the feeder base when the slot insertion portion slides in the one direction to be inserted into the slot.

5. The part feeder according to claim 1, further comprising an engagement protrusion that protrudes from the body downward to be inserted into the slot.

6. The part feeder according to claim 5, wherein the engagement protrusion is arranged behind the slot insertion portion, and the engagement protrusion is pushed against an upper surface of the slot when the fixed member is fixed to the fixing mechanism.

7. The part feeder according to claim 1, wherein the fixing mechanism includes an arm that swings about an axis horizontally intersecting the one direction, and extends from the axis in an unmounting direction opposite to the one direction, the arm includes the stator at a position separated from the axis in the unmounting direction and an operated portion lifted from below by the unfixing member at a position separated from the stator in the unmounting direction, the fixed member includes a cam surface having an inclination that rises as the fixed member is separated from the recess in the unmounting direction and a clearance that is adjacent to a termination end of the cam surface in the unmounting direction and releases the operated portion passed through the cam surface downward by the sliding in the one direction, and the fixing mechanism causes the stator to come into contact with the recess by the arm swung by the elastic force when the operated portion reaches the clearance.

8. The part feeder according to claim 7, wherein the unfixing member causes the arm to swing to lift the stator from the recess by lifting the operated portion positioned at the clearance by the unfixing operation from below.

9. A component mounting machine that includes a part feeder that supplies a component, a feeder base that includes a slot in which the part feeder is mountable, and a mounting head that picks up the component supplied by the part feeder mounted on the slot and mounts the component on a board, the component mounting machine comprising a fixing mechanism for fixing the part feeder to the feeder base, wherein the part feeder includes a body that includes a component supply mechanism that supplies the component at a component extraction position at which the mounting head extracts the component, a slot insertion portion that is provided at the body, and slides in one direction to be inserted into the slot, a fixed member that protrudes in the one direction from the body, and is fixed to the fixing mechanism by sliding in the one direction, an unfixing member that performs an unfixing operation of operating the fixing mechanism to which the fixed member is fixed to release the fixing of the fixed member by the fixing mechanism, an operation member that is displaced by receiving an external force, and a transmission mechanism that transmits the displacement of the operation member to the unfixing member to perform the unfixing operation, wherein the fixing mechanism includes a stator biased in a push-down direction by an elastic member, the fixed member includes a recess opened upward, and the fixed member is fixed to the fixing mechanism by the stator coming into contact with the recess from above by an elastic force of the elastic member.

10. The component mounting machine according to claim 9, wherein the fixing mechanism includes an arm that swings about an axis horizontally intersecting the one direction, and extends from the axis in an unmounting direction opposite to the one direction, the arm includes the stator at a position separated from the axis in the unmounting direction and an operated portion lifted from below by the unfixing member at a position separated from the stator in the unmounting direction, the fixed member includes a cam surface having an inclination that rises as the fixed member is separated from the recess in the unmounting direction and a clearance that is adjacent to a termination end of the cam surface in the unmounting direction and releases the operated portion passed through the cam surface downward by the sliding in the one direction, and the fixing mechanism causes the stator to come into contact with the recess by the arm swung by the elastic force when the operated portion reaches the clearance.

11. The component mounting machine according to claim 10, wherein the unfixing member causes the arm to swing to lift the stator from the recess by lifting the operated portion positioned at the clearance by the unfixing operation from below.

12. The component mounting machine according to claim 9, wherein the transmission mechanism transmits displacement of the operation member in an unmounting direction opposite to the one direction to the unfixing member to cause the unfixing member to perform the unfixing operation.

13. The component mounting machine according to claim 9, wherein the transmission mechanism includes at least a wire.

14. The component mounting machine according to claim 9, further comprising:

a first engaged portion that is provided at a position higher than an upper surface of the feeder base; and a second engaged portion that is provided at a position lower than the upper surface of the feeder base, wherein the part feeder further includes at least one first engaging portion that is engaged with the first engaged portion provided at a distal end of the body, and at least one second engaging portion that is provided below the fixed member of the body, and is engaged with the second engaged portion.

15. The component mounting machine according to claim 9, wherein the part feeder further includes an engagement protrusion that protrudes from the body downward to be inserted into the slot.

16. The component mounting machine according to claim 15, wherein the engagement protrusion is arranged behind the slot insertion portion, and the engagement protrusion is pushed against an upper surface of the slot when the fixed member is fixed to the fixing mechanism.

* * * * *